(12) United States Patent
Pokhil

(10) Patent No.: US 6,181,533 B1
(45) Date of Patent: Jan. 30, 2001

(54) SIMULTANEOUS FIXATION OF THE MAGNETIZATION DIRECTION IN A DUAL GMR SENSOR'S PINNED LAYERS

(75) Inventor: Taras G. Pokhil, Arden Hills, MN (US)

(73) Assignee: Seagate Technology LLC, Scotts Valley, CA (US)

( * ) Notice: Under 35 U.S.C. 154(b), the term of this patent shall be extended for 0 days.

(21) Appl. No.: 09/253,806

(22) Filed: Feb. 19, 1999

(51) Int. Cl.[7] .............................. G11B 5/39; G01R 33/06; H01L 43/00
(52) U.S. Cl. ............... 360/324; 360/324.11; 324/207.21; 324/252; 338/32 R
(58) Field of Search .......................... 360/324, 324.12, 360/326; 338/32 R; 324/207.21, 252

(56) References Cited

U.S. PATENT DOCUMENTS

| | | |
|---|---|---|
| 5,073,836 | 12/1991 | Gill et al. .............................. 360/113 |
| 5,287,238 | 2/1994 | Baumgart et al. .................... 360/113 |
| 5,442,508 | 8/1995 | Smith ................................... 360/113 |
| 5,576,915 | 11/1996 | Akiyama et al. ..................... 360/113 |
| 5,650,887 * | 7/1997 | Dovek ................................... 360/113 |
| 5,701,222 | 12/1997 | Gill et al. .............................. 360/113 |
| 5,701,223 | 12/1997 | Fontana, Jr. et al. ................. 360/113 |
| 5,705,973 | 1/1998 | Yuan et al. .......................... 338/32 R |
| 5,748,399 * | 5/1998 | Gill ....................................... 360/113 |
| 5,856,897 | 1/1999 | Mauri ................................... 360/113 |
| 5,903,415 * | 5/1999 | Gill ....................................... 360/113 |
| 6,118,622 * | 9/2000 | Gill ....................................... 360/113 |

* cited by examiner

*Primary Examiner*—A. J. Heinz
(74) *Attorney, Agent, or Firm*—Kinney & Lange, P.A.

(57) ABSTRACT

The present invention provides a method for forming a dual giant magnetoresistive sensor. First and second spin valves are first formed and arranged such that a dielectric layer is positioned between the first and the second spin valves. The first spin valve has a plurality of layers including a first antiferromagnetic layer and a first pinned layer. The second spin valve has a plurality of layers including a second antiferromagnetic layer and a second pinned layer. First and second currents are supplied respectively to first and second spin valves. The first current generates a first magnetic field on the first pinned layer that orients a magnetization of the first pinned layer in a first desired direction. The second current generates a second magnetic field on the second pinned layer that orients a magnetization of the second antiferromagnetic layer in a second desired direction. While continuing to supply the first and the second currents, the dual giant magnetoresistive sensor is cooled from a temperature greater than Néel temperatures of both first and second antiferromagnetic layers to a temperature below the Néel temperature of both first and second antiferromagnetic layers.

13 Claims, 2 Drawing Sheets

SIMULTANEOUS FIXATION OF THE MAGNETIZATION DIRECTION IN A DUAL GMR SENSOR'S PINNED LAYERS

BACKGROUND OF THE INVENTION

The present invention relates generally to magnetoresistive read sensors for use in magnetic read heads. In particular, the present invention relates to the simultaneous fixation of the magnetization direction in pinned layers of first and second spin valves of a dual giant magnetoresistive read sensor.

A magnetic read head retrieves magnetically-encoded information that is stored on a magnetic medium or disc. The magnetic read head is typically formed of several layers that include atop shield, abottom shield, and aread sensor positioned between the top and bottom shields. The read sensor is generally a type of magnetoresistive sensor, such as a giant magnetoresistive (GMR) read sensor. The resistance of a GMR read sensor fluctuates in response to a magnetic field emanating from a magnetic medium when the GMR read sensor is used in a magnetic read head and positioned near the magnetic medium. By providing a sense current through the GMR read sensor, the resistance of the GMR read sensor can be measured and used by external circuitry to decipher the information stored on the magnetic medium.

A common GMR read sensor configuration is the GMR spin valve configuration in which the GMR read sensor is a multi-layered structure formed of a ferromagnetic free layer, a ferromagnetic pinned layer and a nonmagnetic spacer layer positioned between the free layer and the pinned layer. The magnetization direction of the pinned layer is fixed in a predetermined direction, generally normal to an air bearing surface of the GMR spin valve, while a magnetization direction of the free layer rotates freely in response to an external magnetic field. An easy axis of the free layer is generally set normal to the magnetization direction of the pinned layer. The resistance of the GMR read sensor varies as a finction of an angle formed between the magnetization direction of the free layer and the magnetization direction of the pinned layer. This multi-layered spin valve configuration allows for a more pronounced magnetoresistive effect than is possible with anisotropic magnetoresistive (AMR) read sensors, which generally consist of a single ferromagnetic layer.

Typically, the magnetization of the pinned layer is fixed in the predetermined direction by exchange coupling an antiferromagnetic layer to the pinned layer. The antiferromagnetic layer is positioned upon the pinned layer such that the antiferromagnetic layer and the free layer form distal edges of the GMR spin valve. The spin valve is then heated to a temperature greater than a Néel temperature of the antiferromagnetic layer. Next, a magnetic field oriented in the predetermined direction is applied to the spin valve, thereby causing the magnetization direction of the pinned layer to orient in the direction of the applied magnetic field. The magnetic field may be applied to the spin valve before the spin valve is heated to the temperature greater than the Néel temperature of the antiferromagnetic layer. While continuing to apply the magnetic field, the spin valve is cooled to a temperature lower than the Néel temperature of the antiferromagnetic layer. Once the magnetic field is removed from the spin valve, the magnetization direction of the pinned layer will remain fixed, as a result of the exchange with the antiferromagnetic layer, so long as the temperature of the spin valve remains lower than the Néel temperature of the antiferromagnetic layer.

A second GMR read sensor configuration is a dual GMR sensor having a first spin valve, a second spin valve, and a spacer positioned between the first and second spin valves. Both the first and second spin valves are formed of a free layer, a spacer layer, a pinned layer, and an antiferromagnetic layer. The spacer layer is positioned between the free layer and the pinned layer. The pinned layer is positioned between the free layer and the antiferromagnetic layer. The magnetization direction in the pinned layer of the first spin valve is antiparallel to the magnetization direction in the pinned layer of the second spin valve. The prior art method of fixing the magnetization directions in the pinned layers of the dual GMR sensor requires that the antiferromagnetic layers have substantially different Néel temperatures.

To fix the magnetization directions in the pinned layers of the dual GMR sensor, the multi-layered spin valve is first assembled. In the situation where the Néel temperature of the antiferromagnetic layer of the first spin valve is substantially greater than the Néel temperature of the antiferromagnetic layer of the second spin valve, the dual GMR sensor is heated to a temperature greater than the Néel temperature of the antiferromagnetic layer of the first spin valve. The GMR spin valve is then subjected to a first magnetic field oriented such that the magnetization direction in the pinned layer of the first spin valve orients in a desired direction. The first magnetic field maybe applied to the dual GMR sensor before the dual GMR sensor is heated. While continuing to apply the magnetic field, the dual GMR sensor is cooled to a temperature lower than the Néel temperature of the antiferromagnetic layer of the first spin valve, but greater than the Néel temperature of the antiferromagnetic layer of the second spin valve. The first magnetic field is next removed and a second magnetic field is applied to the dual GMR sensor. The second magnetic field is directed such that the magnetization direction in the pinned layer in the second spin valve orients in the desired direction, which is generally antiparallel to the desired direction of the magnetization direction in the pinned layer ofthe first spin valve. While continuing to apply the second magnetic field to the dual GMR sensor, the temperature of the dual GMR sensor is cooled to a temperature lower than the Néel temperature of the antiferromagnetic layer of the second spin valve.

The magnetization direction in the pinned layers of the first and second spin valve are now fixed, as a result of the exchange with the respective antiferromagnetic layers, so long as the temperature of the dual GMR sensor remains lower than the Néel temperatures of the antiferromagnetic layers. In the case where the Néel temperature of the antiferromagnetic layer of the second spin valve is greater than the Néel temperature of the antiferromagnetic layer of the first spin valve, the dual GMR sensor is first heated to a temperature greater than the Néel temperature of the antiferromagnetic layer of the second spin valve. The second magnetic field is then applied while the temperature ofthe dual GMR sensor is reduced to a temperature lower than the Néel temperature of the antiferromagnetic layer of the second spin valve, yet greater than the Néel temperature of the antiferromagnetic layer of the first spin valve. The second magnetic field is then removed and the first magnetic field applied while the temperature of the dual GMR sensor is reduced to a temperature less than the Néel temperature of the antiferromagnetic layer of the first spin valve.

The first and second spin valves can be connected in either a differential configuration or a gradiometer configuration. In a differential configuration, the output ofthe dual GMR sensor represents the difference between the voltage across the first spin valve and the voltage across the second spin valve. This differential configuration results in a read sensitivity greater than provided by a single spin valve GMR sensor. In a gradiometer configuration, the voltage measured across the first spin valve would be compared to the voltage measured across the second spin valve to measure the gradient of the magnetic field emanating from the magnetic media. This gradiometer configuration is useful in detecting peaks and valleys in the magnetic fields.

There are several inherent problems with the prior art method of fixing the magnetization direction of the pinned layers of a dual GMR sensor. First, the two antiferromagnetic layers must be annealed separately. For each layer, the annealing process can take hours, or even days. For a dual GMR sensor, this annealing process becomes twice as long as required for a single AMR sensor. Second, the temperature within an operating disc drive can reach fairly high temperatures. One of the antiferromagnetic layers of the dual GMR sensor has a Néel temperature substantially lower than the other antiferromagnetic layer. It is, therefore, more likely that the temperature within the operating disc drive would exceed the lower Néel temperature, causing the antiferromagnetic layer (and the pinned layer) associated with that spin valve to lose its fixed magnetization orientation. There is, therefore, a need for a better means of fixing the magnetization directions in pinned layers of a dual GMR sensor.

BRIEF SUMMARY OF THE INVENTION

The present invention provides a method for forming a dual giant magnetoresistive sensor. First and second spin valves are first formed and arranged such that a dielectric layer is positioned between the first and the second spin valves. The first spin valve has a plurality of layers including a first antiferromagnetic layer and a first pinned layer. The second spin valve has a plurality of layers including a second antiferromagnetic layer and a second pinned layer. First and second currents are supplied respectively to first and second spin valves. The first current generates a first magnetic field on the first pinned layer that orients a magnetization of the first pinned layer in a first desired direction. The second current generates a second magnetic field on the second pinned layer that orients a magnetization of the second pinned layer in a second desired direction. While continuing to supply the first and the second currents, the dual giant magnetoresistive sensor is cooled from a temperature greater than Néel temperatures of both first and second antiferromagnetic layers to a temperature below the Néel temperature of both first and second antiferromagnetic layers.

DETAILED DESCRIPTION

Figure 1:
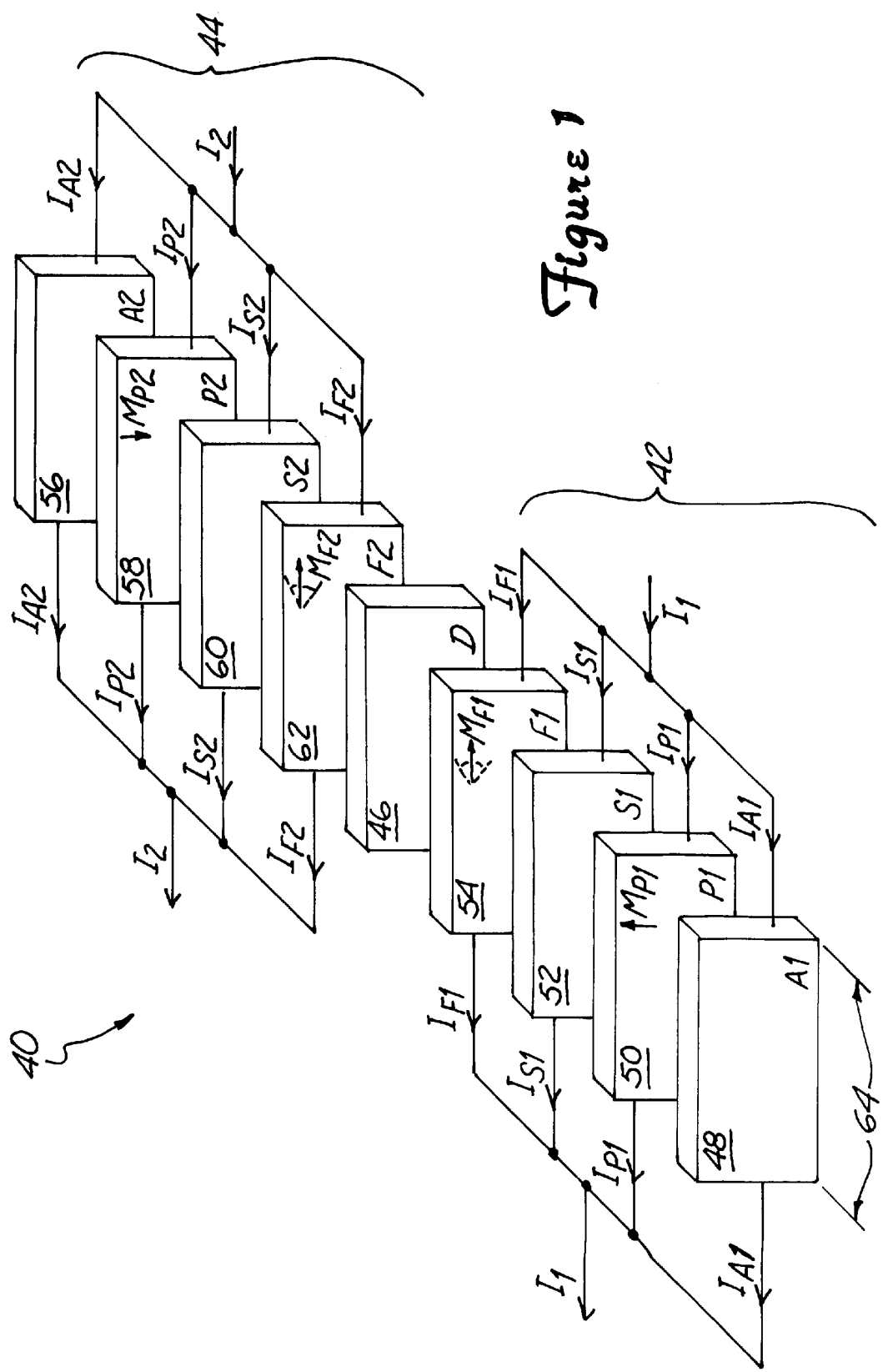
FIG. 1 is an expanded perspective view of a dual giant magnetoresistive read sensor designed according to the present invention.

FIG. 1 is an expanded perspective view of a dual giant magnetoresistive (GMR) read sensor 40 designed according to the present invention. GMR read sensor 40 includes first spin valve 42, second spin valve 44, and dielectric (D) layer 46 positioned between first spin valve 42 and second spin valve 44.

First spin valve 42 includes first antiferromagnetic (A1) layer 48, first pinned (P1) layer 50, first spacer (S1) layer 52, and first free (F1) layer 54. First spacer layer 52 is positioned between first free layer 54 and first pinned layer 50, and first pinned layer 50 is positioned between first free layer 54 and first antiferromagnetic layer 48.

Second spin valve 44 includes second antiferromagnetic (A2) layer 56, second pinned (P2) layer 58, second spacer (S2) layer 60, and second free (F2) layer 62. Second spacer layer 60 is positioned between second free layer 62 and second pinned layer 58, and second pinned layer 58 is positioned between second free layer 62 and second antiferromagnetic layer 56.

Each of the plurality of layers of dual GMR read sensor 40 are spaced apart in FIG. 1 for clarity only, and that in reality, the layers are actually adjacent to each other.

The planes of each of the layers included within first spin valve 42 and second spin valve 44 are each parallel to the plane of dielectric layer 46. First antiferromagnetic layer 48 and second antiferromagnetic layer 56 are both positioned furthest from dielectric layer 46; whereas first free layer 54 and second free layer 62 are both positioned closest to dielectric layer 46. Additional layers could be added to both first and second spin valve 42 and 44. For example, a soft adjacent layer and/or a permanent magnet layer could be added to further fix the magnetization directions in pinned layers.

First free layer 54, first pinned layer 50, second free layer 62, and second pinned layer 58 are each formed of ferromagnetic materials; whereas first spacer layer 52 and second spacer layer 60 are each formed of nonmagnetic materials. In a preferred embodiment, first free layer 54 and second free layer 62 each have a thickness in the range of 2 nanometers to 8 nanometers; first spacer layer 52 and second spacer layer 60 each have a thickness in the range of 2 nanometers to 4 nanometers; first pinned layer 50 and second pinned layer 58 each have a thickness in the range of 2 nanometers to 8 nanometers; and first antiferromagnetic layer 48 and second antiferromagnetic layer 56 each have a thickness in the range of 5 nanometers to 30 nanometers. Dielectric layer 46 preferably has a thickness in the range of 1 nanometers to 5 nanometers.

For first spin valve 42, the magnetization $M_{P1}$, in first pinned layer 50 is fixed in a predetermined first direction, while the magnetization $M_{F1}$ in first free layer 54 is allowed to rotate freely in response to external magnetic fields (not shown in FIG. 1). The resistance of first spin valve 42 varies as a function of an angle formed between magnetization $M_{F1}$ of first free layer 54 and magnetization $M_{P1}$, first pinned layer 50.

Similarly for second spin valve 44, the magnetization $M_{P2}$ in second pinned layer 58 is fixed in a predetermined second direction, while the magnetization $M_{F2}$ in second free layer 62 is allowed to rotate freely in response to external magnetic fields (not shown in FIG. 1). The resistance of second spin valve 44 varies as a function of an angle formed between the magnetization $M_{F2}$ of second free layer 62 and the magnetization $M_{P2}$ of second pinned layer 58.

An easy axis of first free layer 54 is preferably oriented perpendicular to the direction of magnetization $M_{P1}$ of first pinned layer 50, and an easy axis of second free layer 62 is preferably oriented perpendicular to the magnetization $M_{P2}$ of second pinned layer 58 and either parallel or antiparallel to the easy axis of first free layer 62. In absence of an external magnetic field acting on GMR read sensor 40, the direction of magnetization $M_{F1}$ of first free layer 54 and the direction of magnetization $M_{F2}$ of second free layer 62 will be in the easy axis direction.

In a preferred embodiment, the sheet resistance of first pinned layer 50 and the sheet resistance of first antiferromagnetic layer 48 are both preferably substantially greater than either the sheet resistance of first free layer 54 or the sheet resistance of first spacer layer 52. Similarly, the sheet resistance of second pinned layer 58 and the sheet resistance of second antiferromagnetic layer 56 are both preferably substantially greater than either the sheet resistance of second free layer 62 and second spacer layer 60. Thus, current flowing through first spin valve 42 will remain mostly within first free layer 54 and first spacer layer 52, and current flowing through second spin valve 44 will remain mostly within second free layer 62 and second spacer layer 60.

Once the structure of dual spin valve 40 is formed, as described with reference to FIG. 1, the directions of the magnetization $M_{P1}$ of first pinned layer 50 and the magnetization $M_{P2}$ of the second pinned layer 58 each are fixed in the desired directions. More specifically, the direction of magnetization $M_{P1}$ of first pinned layer 50 is fixed in a predetermined first direction, generally normal to air bearing surface 64 of GMR read sensor 40. Similarly, the direction of magnetization $M_{P2}$ of second pinned layer 58 is fixed in a predetermined second direction, preferably antiparallel to the predetermined first direction.

To initially achieve the direction of magnetization $M_{P1}$ of first pinned layer 50, a first current $I_1$, indicated in FIG. 1 by an arrow, is supplied to first spin valve 42. First current $I_1$ is directed parallel to air bearing surface 64 and along the plane of each of the layers of first spin valve 42. As previously discussed, the sheet resistance of each layer of first spin valve 42 is preferably selected so that most of first current $I_1$ flowing through first spin valve 42 will be in first free layer 54 and first spacer layer 52. Accordingly, first free layer current $I_{F1}$ which is the portion of first current $I_1$ flowing through first free layer 54, and first spacer layer current $I_{S1}$, which is the portion of first current $I_1$ flowing through first spacer layer 52, both generate a magnetic field $H_1$ upon first pinned layer 50. First pinned layer current $I_{P1}$ which is the portion of first current $I_1$ flowing through first pinned layer 50, and first antiferromagnetic layer current $I_{A1}$, which is the portion of first current $I_1$ flowing through first antiferromagnetic layer 48, are both small in comparison to first free layer current $I_{F1}$ and first spacer layer current $I_{S1}$.

Figure 1A:
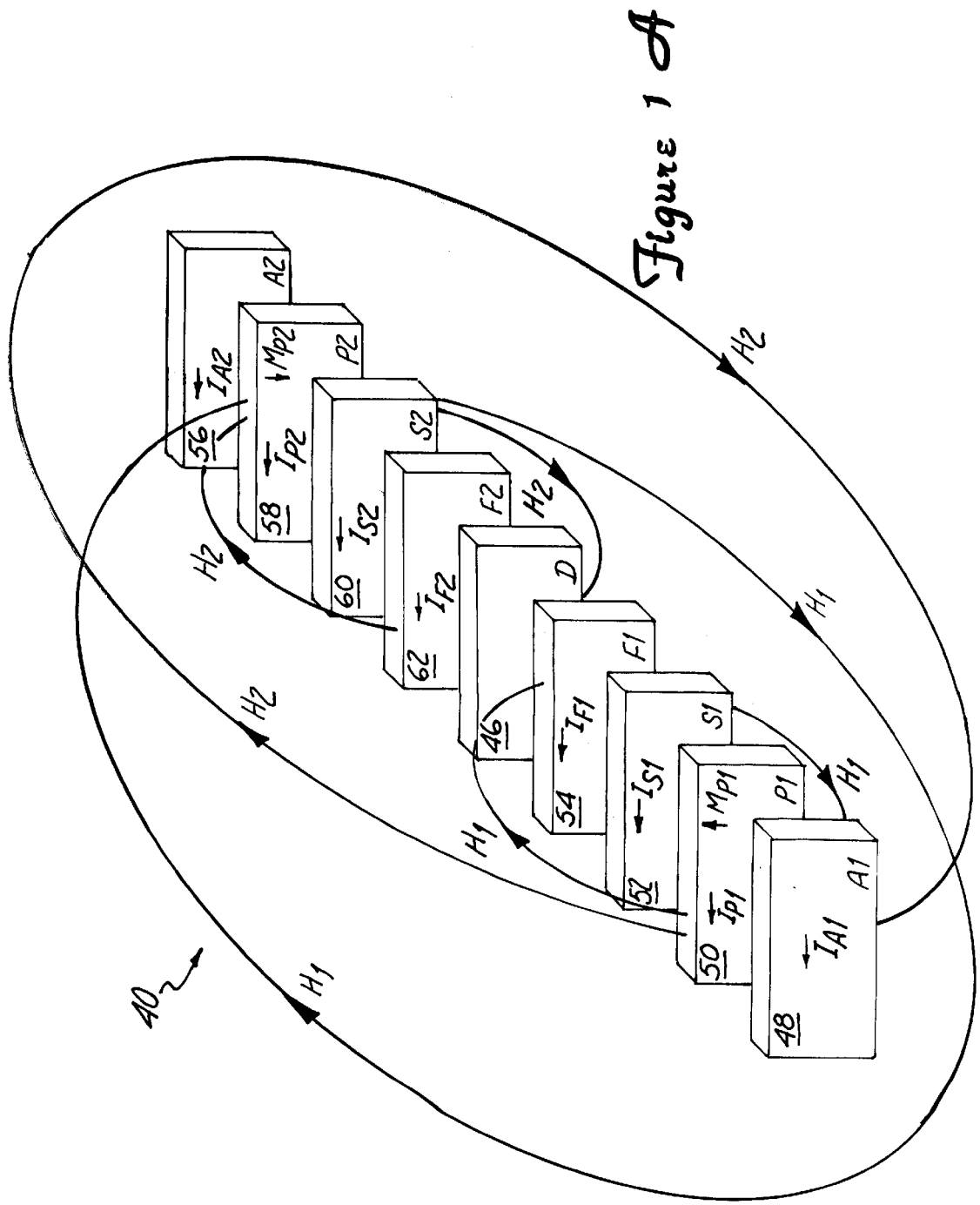
FIG. 1A shows internally generated magnetic fields acting upon the dual giant magnetoresistive read sensor of FIG. 1.

The direction of magnetic field $H_1$ depends upon the flow direction of first current $I_1$. The first desired direction of magnetization $M_{P1}$ of first pinned layer 50 is upward (as shown in FIG. 1A). To induce magnetic field $H_1$ to flow downward (as shown in FIG. 1A) through both first free layer 54 and first spacer layer 52 and upward (as shown in FIG. 1A) through both first pinned layer 50, the right-hand rule dictates that the flow direction of first current $I_1$ be from the right to the left (as shown in FIG. 1A). In such a configuration, the magnetic field $H_1$ causes the direction of magnetization $M_{P1}$ of first pinned layer 50 to orient in the first desired direction (upward, as shown in FIG. 1A). If the first desired direction were downward in FIG. 1A, the flow direction of first current $I_1$ would be from the left to the right.

To initially achieve the direction of magnetization $M_{P2}$ of second pinned layer 58, a second current $I_2$, indicated in FIG. 1 by an arrow, is supplied to second spin valve 44. Second current $I_2$ is directed parallel to air bearing surface 64 and along the plane of each of the layers of second spin valve 44. As previously discussed, the sheet resistance of each layer of second spin valve 44 is preferably selected so that most of second current $I_2$ flowing through second spin valve 44 will be in second free layer 62 and second spacer layer 60. Accordingly, second free layer current $I_{F2}$, which is the portion of second current $I_2$ flowing through second free layer 62 and second spacer layer current $I_{S2}$, which is the portion of second current $I_2$ flowing through second spacer layer 60, generate a magnetic field $H_2$ upon second pinned layer 58. Second pinned layer current $I_{P2}$, which is the portion of second current $I_2$ flowing through second pinned layer 58, and second antiferromagnetic layer current $I_{A2}$, which is the portion of second current $I_2$ flowing through second antiferromagnetic layer 56, are both small in comparison to second free layer current $I_{F2}$ and second spacer layer current $I_{S2}$.

The direction of magnetic fields $H_2$ depends upon the flow direction of second current $I_2$. The second desired direction of magnetization $M_{P2}$ of second pinned layer 58 is downward (as shown in FIG. 1A). To induce magnetic field $H_2$ to flow upward (as shown in FIG. 1A) through both second free layer 62 and second spacer layer 60 and downward (as shown in FIG. 1A) through second pinned layer 58, the right-hand rule dictates that the flow direction of second current $I_2$ be from the right to the left (as shown in FIG. 2A). In such a configuration, magnetic fields $H_2$ causes the direction of magnetization $M_{P2}$ of second pinned layer 58 to orient in the second desired direction (downward, as shown in FIG. 1A). If the second desired direction were upward in FIG. 1A, the flow direction of second current $I_2$ would be from the left to the right.

First current $I_1$ flowing through first spin valve 42 will also generate magnetic field $H_1$ upon second pinned layer 58, serving to further enforce the desired direction of magnetization $M_{P2}$ of second pinned layer 58. Similarly, second current $I2$ flowing through second spin valve 44 will generate magnetic field $H_2$ upon first pinned layer 50, serving to further enforce the desired direction of magnetization $M_{P1}$ of first pinned layer 50.

Once the magnetization directions in pinned layers ofboth first and second spin valves 42 and 44 are oriented in desired directions, dual GMR read sensor 40 is heated to a temperature in excess of the Neel temperature of both first and second antiferromagnetic layers 48 and 56. Dual GMR read sensor 40 is held at that first temperature for a time sufficient to permanently fix the magnetization directions of first and second pinned layers 50 and 58 in the desired directions. Dual GMR read sensor 40 may be heated to the first temperature before first current $I_1$ is supplied to first spin valve 42 and second current $I_2$ is supplied to second spin valve 44.

Dual GMR read sensor 40 is then cooled to a temperature lower than the Néel temperatures of both first and second antiferromagnetic layers 48 and 56 while first current $I_1$ and second current $I_2$ are continuously supplied. Once dual GMR read sensor 40 has cooled, the direction of magnetization $M_{P1}$ of first pinned layer 50 and the direction of magnetization $M_{P2}$ of second pinned layer 58 are permanently fixed.

In a preferred embodiment, first antiferromagnetic layer 48 has a Néel temperature substantially equal to a Neel temperature of second antiferromagnetic layer 56. It is further preferred that first antiferromagnetic layer 48 and second antiferromagnetic layer 56 each have aNeel temperature in the range of 100° C. to 300° C.

In summary, the present invention is advantageous over the prior art in that it eliminates the need to separately anneal two separate antiferromagnetic layers. By simultaneously providing magnetic fields on both first and second pinned layers 50 and 58 by means of first and second currents $I_1$ and $I_2$ flowing through first and second spin valves 42 and 44, it is no longer necessary to separately anneal first and second antiferromagnetic layers 48 and 56. In the prior art, the magnetic fields used to fix the directions of magnetization $M_{P1}$ of first pinned layer 50 and magnetization $M_{P2}$ of second pinned layer 58 were applied externally. It would be much more difficult to separately isolate the first and the second magnetic fields to apply separately to first and second spin valves 42 and 44 than is possible with the present invention.

Although the present invention has been described with reference to preferred embodiments, workers skilled in the art will recognize that changes may be made in form and detail without departing from the spirit and scope of the invention.

What is claimed is:

1. A dual giant magnetoresistive read sensor comprising:
   first and second spin valves separated by a dielectric layer, the first spin valve having a plurality of layers including a first pinned layer and the second spin valve having a plurality of layers including a second pinned layer; and
   means for simultaneously fixing a magnetization of the first pinned layer and a magnetization of the second pinned layer.

2. A method for forming a dual giant magnetoresistive read sensor, the method comprising:
   forming first and second spin valves separated by a dielectric layer, the first spin valve having a plurality of layers including a first antiferromagnetic layer exchange coupled to a first pinned layer and the second spin valve having a plurality of layers including a second antiferromagnetic layer exchange coupled to a second pinned layer;
   supplying a first current to the first spin valve, the first current generating a first magnetic field on the first pinned layer orienting a magnetization of the first pinned layer in a first desired direction;
   supplying a second current to the second spin valve, the second current generating a second magnetic field on the second pinned layer orienting a magnetization of the second pinned layer in a second desired direction; and
   cooling the dual giant magnetoresistive sensor, while continuing to supply the first and the second currents, from a temperature greater than Néel temperatures of both the first and the second antiferromagnetic layers to a temperature lower than the Néel temperatures of both the first and the second antiferromagnetic layers.

3. The method of claim 2 wherein the first and the second spin valves are arranged such that the first antiferromagnetic layer is a furthest layer of each of the plurality of layers of the first spin valve from the dielectric layer and the second antiferromagnetic layer is a furthest layer of each of the plurality of layers of the second spin valve from the dielectric layer.

4. The method of claim 2 wherein the first desired direction is antiparallel to the second desired direction.

5. The method of claim 2 wherein an easy axis of a first free layer of the first spin valve is oriented antiparallel to an easy axis of a second free layer of the second spin valve.

6. The method of claim 2 wherein an easy axis of a first free layer of the first spin valve is oriented parallel to an easy axis of a second free layer of the second spin valve.

7. The method of claim 2 wherein the Néel temperature of the first antiferromagnetic layer substantially equals the Néel temperature of the second antiferromagnetic layer.

8. A dual giant magnetoresistive read sensor for use in a magnetic storage system, the dual giant magnetoresistive read sensor comprising:
   first and second spin valves separated by a dielectric layer, the first spin valve having a plurality of layers including a first antiferromagnetic layer exchange coupled to a first pinned layer and the second spin valve having a plurality of layers including a second antiferromagnetic layer exchange coupled to a second pinned layer; and
   wherein the first and the second pinned layers have magnetization directions determined by first and second magnetic fields produced by current flow through the first and the second spin valves, respectively, as the dual giant magnetoresistive sensor was cooled from a temperature greater than Néel temperatures of both the first and the second antiferromagnetic layers to a temperature lower than the Néel temperatures of both the first and the second antiferromagnetic layers.

9. The dual giant magnetoresistive read sensor of claim 8 wherein the first and the second spin valves are arranged such that the first antiferromagnetic layer is a furthest layer of each of the plurality of layers of the first spin valve from the dielectric layer and the second antiferromagnetic layer is a furthest layer of each of the plurality of layers of the second spin valve from the dielectric layer.

10. The dual giant magnetoresistive read sensor of claim 8 wherein the first magnetic field oriented the magnetization of the first pinned layer in a first desired direction and the second magnetic field oriented the magnetization of the second pinned layer in a second desired direction antiparallel to the first desired direction.

11. The dual giant magnetoresistive read sensor of claim 8 wherein an easy axis of a first free layer of the first spin valve is oriented antiparallel to an easy axis of a second free layer of the second spin valve.

12. The dual giant magnetoresistive read sensor of claim 8 wherein an easy axis of a first free layer of the first spin valve is oriented parallel to an easy axis of a second free layer of the second spin valve.

13. The dual giant magnetoresistive read sensor of claim 8 wherein the Néel temperature of the first antiferromagnetic layer substantially equals the Neel temperature of the second antiferromagnetic layer.

\* \* \* \* \*